US007638767B2

United States Patent
Yamaguchi et al.

(10) Patent No.: US 7,638,767 B2
(45) Date of Patent: Dec. 29, 2009

(54) SCANNING ELECTRON MICROSCOPE

(75) Inventors: Kohei Yamaguchi, Hitachinaka (JP); Kenji Obara, Kawasaki (JP)

(73) Assignee: Hitachi High-Technologies Corporation, Tokyo (JP)

( * ) Notice: Subject to any disclaimer, the term of this patent is extended or adjusted under 35 U.S.C. 154(b) by 341 days.

(21) Appl. No.: 11/655,167

(22) Filed: Jan. 19, 2007

(65) Prior Publication Data
US 2007/0170358 A1    Jul. 26, 2007

(30) Foreign Application Priority Data
Jan. 26, 2006    (JP)    ............... 2006-018080

(51) Int. Cl.
*G21K 7/00*    (2006.01)

(52) U.S. Cl. ............ 250/311; 250/310; 250/307; 250/306; 250/397; 250/492.1; 850/8; 850/9; 850/62

(58) Field of Classification Search ......... 250/306, 250/307, 310, 311, 396 R, 397, 398, 399, 250/492.1, 492.2; 850/8, 9, 62
See application file for complete search history.

(56) References Cited

U.S. PATENT DOCUMENTS

| | | | | |
|---|---|---|---|---|
| 4,670,652 A | * | 6/1987 | Ichihashi et al. | 250/310 |
| 4,835,385 A | * | 5/1989 | Kato et al. | 250/310 |
| 4,912,313 A | * | 3/1990 | Kato et al. | 250/307 |
| 4,941,980 A | | 7/1990 | Halavee et al. | |
| 5,001,344 A | * | 3/1991 | Kato et al. | 250/307 |
| 6,201,240 B1 | * | 3/2001 | Dotan et al. | 250/310 |
| 6,627,886 B1 | * | 9/2003 | Shachal et al. | 850/9 |
| 6,930,308 B1 | * | 8/2005 | Lorusso et al. | 850/5 |
| 7,181,060 B2 | * | 2/2007 | Honda et al. | 382/151 |
| 2005/0206958 A1 | * | 9/2005 | Inamura | 358/3.23 |
| 2007/0230768 A1 | * | 10/2007 | Adler et al. | 382/144 |

FOREIGN PATENT DOCUMENTS

| | | |
|---|---|---|
| JP | 2000-173526 A | 6/2000 |
| JP | 2002-116161 A | 4/2002 |

* cited by examiner

*Primary Examiner*—David A Vanore
*Assistant Examiner*—Michael J Logie
(74) *Attorney, Agent, or Firm*—McDermott Will & Emery LLP

(57) ABSTRACT

There is provided an electron microscope which can clearly detect a microscopic unevenness in a sample. According to a scanning electron microscope, when luminance signals from one pair of backscattered electron detectors are given by L and R, and when a luminance signal from a scattered electron detector is given by S, an adjustment value Lc of L and an adjustment value Rc of R are calculated by using primary homogeneous expressions of L, R, and S.

17 Claims, 7 Drawing Sheets

202  201
 203

204  205

204  206

202  201
  203

SCANNING ELECTRON MICROSCOPE

BACKGROUND OF THE INVENTION

1. Field of the Invention

The present invention relates to a scanning electron microscope and, more particularly, to a scanning electron microscope which displays a grayscale image.

2. Description of the Related Art

In the manufacturing process of a semiconductor, in order to increase a yield, defects must be inspected, and causes of the defects must be investigated. In inspection of defects, an observing apparatus such as a scanning electron microscope or optical microscope is used.

In the scanning electron microscope, scattered electrons and backscattered electrons are generated by irradiating a primary electron beam on a sample to obtain a scattered electron image and a backscattered electron image.

The scattered electron image corresponds to an image obtained when illumination light is irradiated from the same direction as that of an observing direction to observe a sample. Therefore, a sharp pattern edge, a change of materials, and the like are displayed. However, microscopic unevenness cannot be clearly displayed. A backscattered electron image corresponds to an image obtained when illumination light is irradiated from a direction oblique to an observing direction to observe a sample. Therefore, since a grayscale profile image can be obtained, a microscopic unevenness can be clearly displayed.

Defects of a semiconductor include various types of defects. As typical defects, a foreign matter or contamination caused by residual of chemicals, pattern cracking, scratches generated in a polishing step, unevenness in a preprocess, and the like are known.

A microscopic unevenness such as a scratch generally has a low S/N ratio, so that the unevenness can be imaged as a backscattered electron image rather than a scattered electron image. However, a very microscopic scratch cannot obtain a sufficient S/N ratio even though a backscattered electron image is used, a clear image may not be obtained.

Methods of clearly picking up an image of the microscopic unevenness are described in the following Patent Documents. In these methods, a plurality of detectors is used.

[Patent Document 1] Japanese Patent Application Laid-Open No. 2002-116161

[Patent Document 2] U.S. Pat. No. 4,941,980

[Patent Document 3] Japanese Patent Application Laid-Open No. 2000-173526

In the examples described in the above Patent Documents, a plurality of detectors is used. However, when an unevenness of a sample is microscopic, the S/N ratios of signals detected by the detectors become low. Therefore, use of the plurality of detectors does not make it possible to clearly detect the microscopic unevenness.

SUMMARY OF THE INVENTION

It is an object of the present invention to provide an electron microscope which can clearly detect a microscopic unevenness in a sample.

According to a scanning electron microscope according to the present invention, when luminance signals from one pair of backscattered electron detectors are given by L and R, an adjustment value Lc of the luminance signal L and an adjustment value Rc of the luminance signal R are calculated by using primary homogeneous expressions of the luminance signal L and the luminance signal R.

According to the scanning electron microscope according to the present invention, when a luminance signal from a scattered electron detector is given by S, the adjustment value Lc of the luminance signal L and the adjustment value Rc of the luminance signal R are calculated by using primary homogeneous expressions of the luminance signal L, the luminance signal R, and the luminance signal S.

According to the present invention, even a microscopic unevenness in a sample can be clearly detected.

DESCRIPTION OF THE PREFERRED EMBODIMENTS

Figure 1:
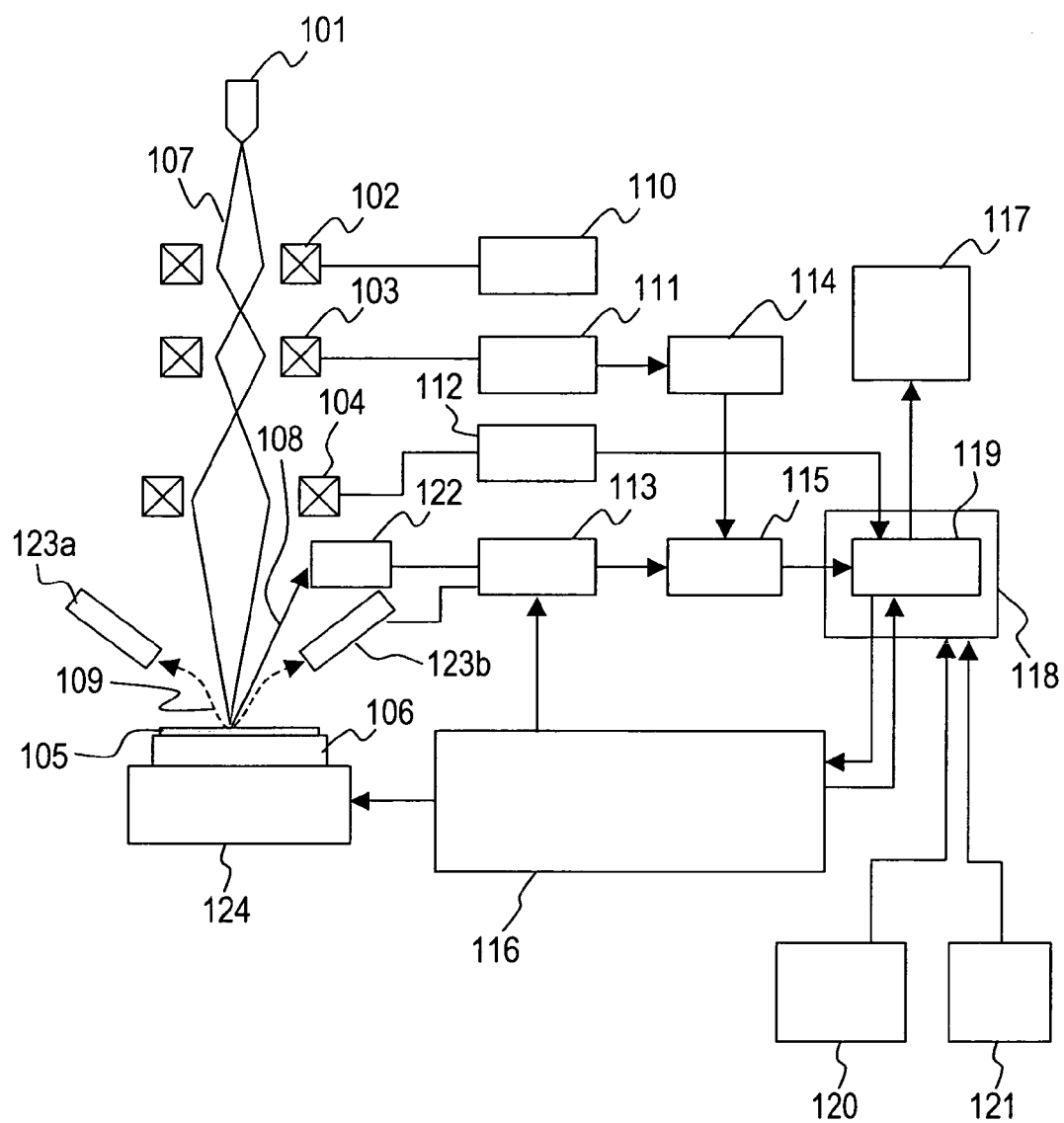
FIG. 1 is a diagram showing the configuration of a scanning electron microscope according to the present invention.

An example of a scanning electron microscope according to the present invention will be explained with reference to FIG. 1. The scanning electron microscope of this example has an electron gun 101, an electron lens 102, a deflector 103, an objective lens 104, a scattered electron detector 122, backscattered electron detectors 123a and 123b, and a sample table 106 which holds a sample 105. Although these constituent elements are stored in a vacuum column, the vacuum column is not shown in FIG. 1. The backscattered electron detectors 123a and 123b are arranged at symmetrical positions on both sides of an axis to image a pair of grayscale images.

The scanning electron microscope of the example further has a lens control circuit 110 which controls the electron lens 102, a deflector control circuit 111 which controls the deflector 103, an objective lens control circuit 112 which controls the object lens 104, an A/D converter 113 which converts analog image signals from the scattered electron detector 122 and the backscattered electron detectors 123a and 123b into digital image signals, an address control circuit 114 which generates an address synchronized with a scanning signal, an image memory 115 which stores a digital image signal depending on the address from the address control circuit 114, a control unit 116 which controls the scanning electron microscope as a whole, a display 117 which displays an image, a computer 118 having an image processing unit 119, a keyboard 120, a mouse 121, and a moving stage 124 which two-dimensionally moves the sample table 106 depending on a control signal from the control unit 116.

An electron beam 107 radiated from the electron gun 101 is converged by the electron lens 102, two dimensionally scanned by the deflector 103, converged by the objective lens 104, and irradiated on the sample 105.

When the electron beam 107 is irradiated on the sample 105, scattered electrons 108 and backscattered electrons 109 are generated from the sample 105. The scattered electrons 108 are detected by the scattered electron detector 122 and the backscattered electrons 109 are detected by the backscattered electron detectors 123a and 123b.

Analog image signals from the scattered electron detector 122 and the backscattered electron detectors 123a and 123b are converted into digital image signals by the A/D converter 113. The digital image signals are sent to the image memory 115. The image memory 115 stores the digital image signals on the basis of addresses given by the address control circuit 114. The image memory 115 transfers image data to the image processing unit 119 at any time. The image processing unit 119 calculates the image data to adjust an image of a sample. On the display 117, the adjusted sample image is displayed on real time. The image processing unit 119 may comprise a plurality of functions. The image processing unit 119 must have at least both a function of adding and subtracting the image data and a function of multiplying the image data by a predetermined value.

An L image and an R image serving as grayscale images are obtained by the image signals from the backscattered electron detectors 123a and 123b. More specifically, the backscattered electron detector 123a on the left detects electrons radiated from a sample surface to the left. The L image is obtained from a detection signal from the backscattered electron detector 123a on the left. The L image corresponds to an optical image obtained by irradiating illumination light to the sample from an obliquely left side. The backscattered electron detector 123b on the right detects electrons radiated from the sample surface to the right. The R image is obtained by a detection signal from the backscattered electron detector 123b on the right. The R image corresponds to an optical image obtained by irradiating illumination light to the sample from an obliquely right side.

Since the backscattered electrons from the sample have directivity in radial directions, the backscattered electrons are suitable for obtaining an uneven image of the surface of the sample.

An S image serving as a scattered electron image is obtained by an image signal from the scattered electron detector 122. Since scattered electrons from the sample do not have directivity in radial directions, the S image is not suitable for obtaining an uneven image of the surface of the sample. A change in material or the like on the sample surface can be inspected by the S image.

A method of adjusting the image of the sample by the image processing unit 119 according to the present invention will be described below with reference to FIGS. 2A to 2J and FIGS. 3A to 3I. In what follows, luminance signals of the L image, the R image, and the S image are indicated by L, R, and S, respectively.

Figure 2:
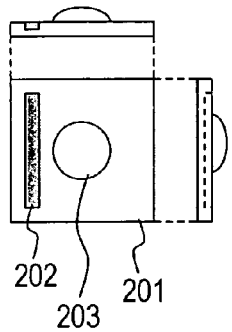
FIGS. 2A to 2J are explanatory diagrams for explaining a method of synthesizing image data according to the present invention.
Figure 2:
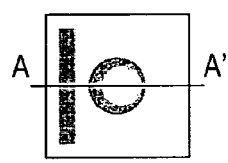
Figure 2:
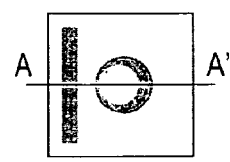
Figure 2:
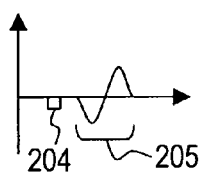
Figure 2:
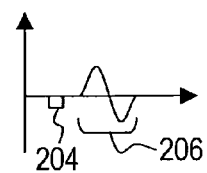
Figure 2:
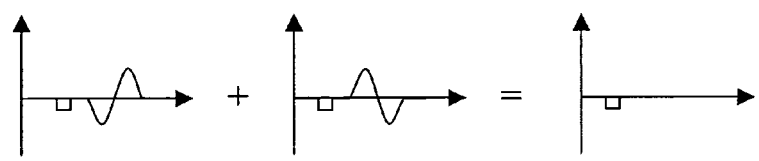
Figure 2:
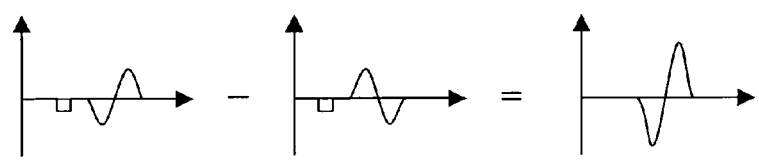
Figure 2:
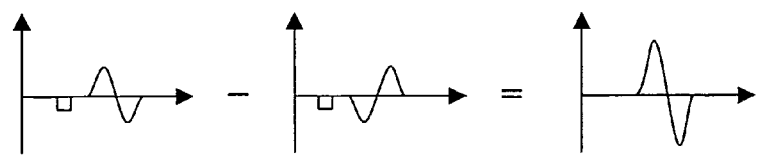
Figure 2:
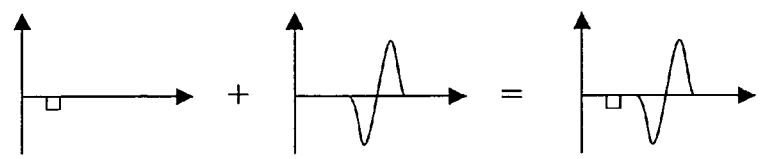
Figure 2:
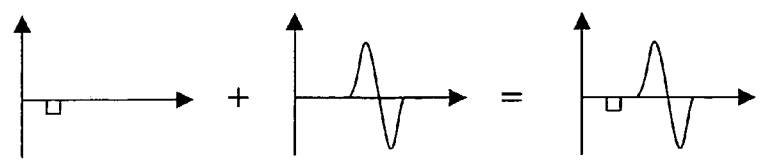

FIG. 2A is a diagram showing an outline of a sample. A sample 201 has a band-like portion 202 and a circular projecting portion 203 which are embedded in a flat surface of the sample 201 and the materials of which are different from materials therearound. FIG. 2B shows the L image of the sample 201, and FIG. 2C shows an R image of the sample 201. FIG. 2D shows a luminance profile of the S image along a line A-A' in FIG. 2B. FIG. 2E shows a luminance profile of the R image along a line A-A' in FIG. 2C. As is apparent from comparison between FIGS. 2D and 2E, luminance profiles 204 of images of the band-like portion 202 are equal to each other. However, the luminance profiles 205 and 206 of the image of the circular projecting portion 203 have a relationship between an image and a reflected image thereof. More specifically, the material contrasts are equal to each other, and uneven contrasts have a relationship between an image and a reflected image thereof.

As shown in FIG. 2F, a luminance of the L image in FIG. 2D and a luminance of the R image in FIG. 2E are added to each other, and the additional value is divided by two. In this case, only a luminance of the image of the band-like portion 202 is left, and a luminance of an image of a projecting portion is canceled out to be zero. FIG. 2F shows a case in which the following equation is calculated.

$$P=(L+R)/2 \qquad \text{Equation 1}$$

As shown in FIG. 2G, when the luminance of the R image in FIG. 2E is subtracted from the luminance of the L image in FIG. 2D, the luminance of the image of the band-like portion 202 is eliminated, and an L image obtained when the image of the circular projecting portion 203 is amplified in luminance is obtained. FIG. 2G shows a case in which the following equation is calculated:

$$L_1=(L-R) \qquad \text{Equation 2}$$

As shown in FIG. 2H, when the luminance of the L image in FIG. 2D is subtracted from the luminance of the R image in FIG. 2E, the luminance of the image of the band-like portion 202 is eliminated, and an R image obtained when the image of the circular projecting portion 203 is amplified in luminance is obtained. FIG. 2H shows a case in which the following equation is calculated.

$$R_1=(R-L) \qquad \text{Equation 3}$$

As shown in FIG. 2I, when a luminance of the image of the band-like portion 202 in FIG. 2F and a luminance of the L image obtained by amplifying the image of the circular projecting portion 203 in luminance in FIG. 2G are added to each other, a luminance profile obtained by synthesizing the luminance of the image of the band-like portion 202 with the L image obtained by amplifying the image of the circular projecting portion 203 in luminance is obtained. FIG. 2I shows a case in which the following equation is calculated:

$$L_2=P+L_1=(L+R)/2+(L-R)=1.5L-0.5R \qquad \text{Equation 4}$$

In Equation 4, on occasions when a degree of amplification of the image of the circular projecting portion 203 of the L image is changed, $L_1$ may be multiplied by coefficient $\alpha$ where $0 \leq \alpha \leq 3$.

$$L_3=P+\alpha L_1=(L+R)/2+\alpha(L-R)=(\alpha+0.5)L+(-\alpha+0.5)R \qquad \text{Equation 5}$$

As shown in FIG. 2J, when a luminance of the image of the band-like portion 202 in FIG. 2F is added to a luminance of the R image obtained by amplifying the image of the circular projecting portion 203 in luminance in FIG. 2H, a luminance profile obtained by synthesizing the luminance of the image of the band-like portion 202 with the R image obtained by amplifying the image of the circular projecting portion 203 in luminance. FIG. 2J shows a case in which the following equation is calculated.

$$R_2=P+R_1=(L+R)/2+(R-L)=1.5R-0.5L \qquad \text{Equation 6}$$

In Equation 6, on occasions when a degree of amplification of the luminance of the image of the circular projecting portion 203 of the R image is changed, $R_1$ may be amplified by a coefficient $\alpha$.

$$R_3=P+\alpha R_1=(L+R)/2+\alpha(R-L)=(\alpha+0.5)R+(-\alpha+0.5)L \qquad \text{Equation 7}$$

As described above, in this example, adjustment values $L_1$, $L_2$, and $L_3$ of the luminance signal L and adjustment values $R_1$, $R_2$, and $R_3$ of the luminance signal R are expressed by primary homogeneous expressions of the luminance signals L and R, respectively.

Figure 3:
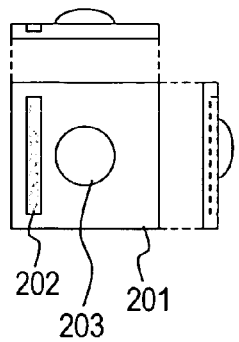
FIGS. 3A to 3I are explanatory diagrams for explaining a method of synthesizing image data according to the present invention.
Figure 3:
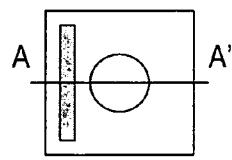
Figure 3:
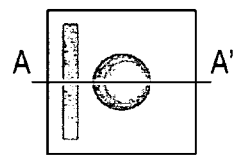
Figure 3:
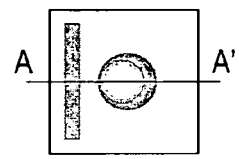
Figure 3:
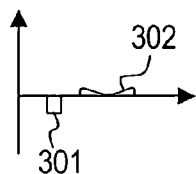
Figure 3:
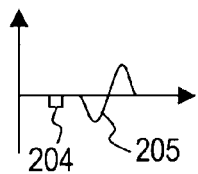
Figure 3:
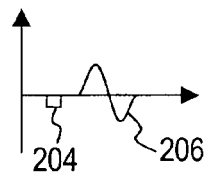
Figure 3:
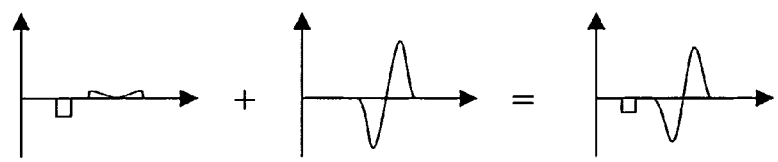
Figure 3:
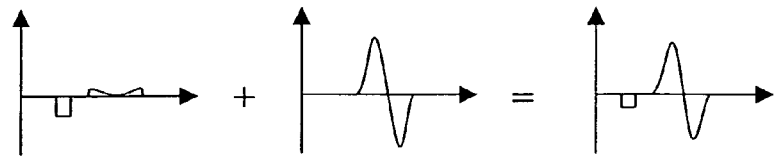

FIG. 3A is a diagram showing an outline of a sample. A sample 201 has a band-like portion 202 and a circular projecting portion 203 which are buried in a flat surface of the sample 201 and the materials of which are different from materials therearound. FIG. 3B shows an S image of the sample 201, and FIG. 3C shows an L image of the sample 201. FIG. 3D shows an R image of the sample 201. FIG. 3E shows a luminance profile of the S image along a line A-A' in FIG. 3B. FIG. 3F shows a luminance profile of the L image along a line A-A' in FIG. 3C. FIG. 3G shows a luminance profile of the R image along a line A-A' in FIG. 3D. As is apparent from comparison between FIGS. 3E and 3F or 3G, a material contrast of the S image is larger than that of the L image or the R image, but an uneven contrast of the S image is smaller than that of the L image or the R image.

As shown in FIG. 3H, a luminance of the S image in FIG. 3E and the L image obtained by amplifying the image of the circular projecting portion 203 in luminance in FIG. 2G are added to each other, the luminance of the image of the band-like portion 202 and the luminance of the image of the circular projecting portion 203 of the L image are obtained as amplified luminances. FIG. 3H shows a case in which the following equation is calculated:

$$L_{s1}S + L_1 = S + (L-R) \qquad \text{Equation 8}$$

In Equation 8, on occasions when relative intensities of the luminance of the S image and the luminance of the image of the circular projecting portion 203 of the L image are changed, S may be multiplied by a coefficient $\alpha$, and $L_1$ may be multiplied by a coefficient $(1-\alpha)$.

$$L_{s2} = \alpha S + (1-\alpha)L1 = \alpha S + (1-\alpha)(L-R) \qquad \text{Equation 9}$$

As shown in FIG. 3I, when the luminance of the S image in FIG. 3E and the R image obtained by amplifying the image of the circular projecting portion 203 in luminance in FIG. 2H are added to each other, the luminance of the image of the band-like portion 202 and the luminance of the image of the circular projecting portion 203 of the R image are obtained as amplified luminances. FIG. 3I shows a case in which the following equation is calculated.

$$R_{S1} = S + R_1 = S + (R-L) \qquad \text{Equation 10}$$

In Equation 10, on occasions when relative intensities of the luminance of the S image and the luminance of the image of the circular projecting portion 203 are changed, S may be multiplied by a coefficient $\alpha$, and $R_1$ may be multiplied by a coefficient $(1-\alpha)$.

$$R_{s2} = \alpha S + (1-\alpha)R1 = \alpha S + (1-\alpha)(R-L) \qquad \text{Equation 11}$$

Figure 4:
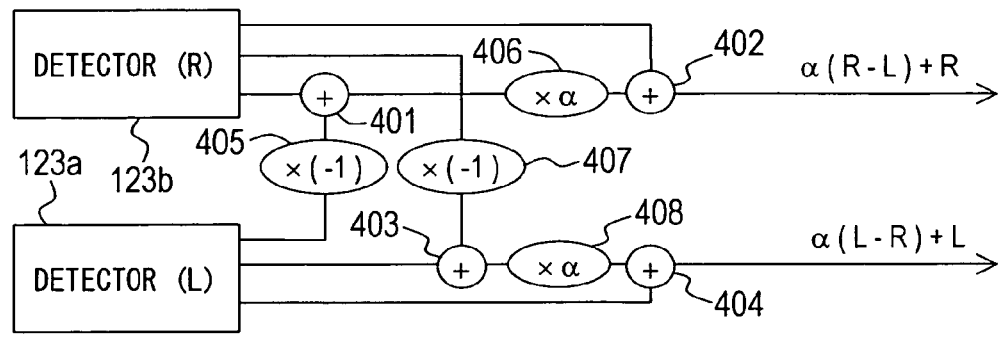
FIGS. 4A to 4B are explanatory diagrams for explaining a method of synthesizing image data according to the present invention.
Figure 4:
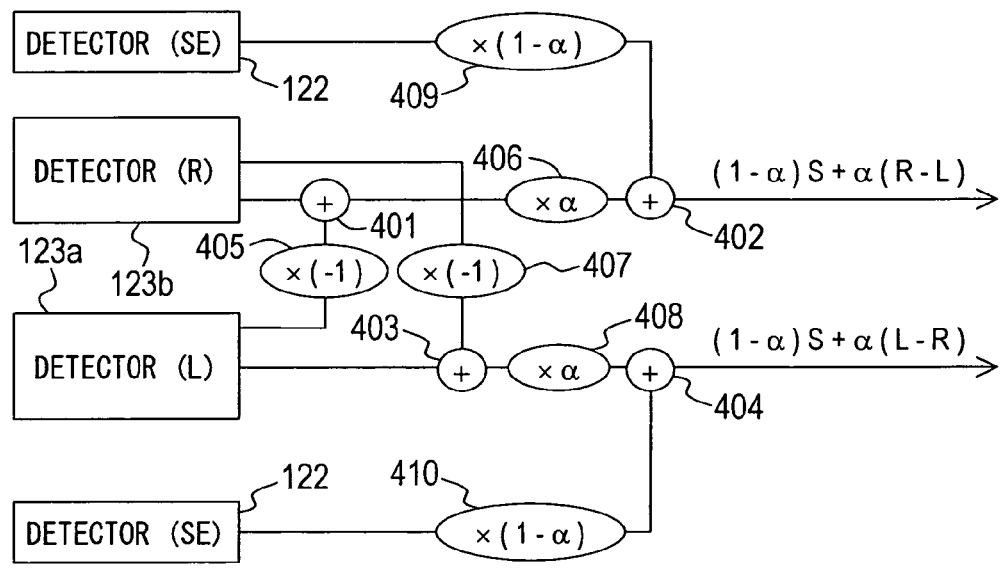

Another example of the method of adjusting an image of a sample by the image processing unit 119 according to the present invention will be described below with reference to FIGS. 4A and 4B. Note that $0 \leq \alpha \leq 1$ is satisfied. An example shown in FIG. 4A will be described first. A first adder 401 adds an output from the backscattered electron detector 123a through a coefficient multiplier 405 to an output from the detector 123b to output R-L. A second adder 402 adds an output from the first adder 401 through a coefficient multiplier 406 to an output from the detector 123b. Therefore, an image signal expressed by the following equation is generated:

$$R_4 = \alpha(R-L) + R \qquad \text{Equation 12}$$

A third adder 403 adds an output from the detector 123b through a coefficient multiplier 407 to the output from the detector 123a to output L-R. A fourth adder 404 adds an output from the third adder 403 through a coefficient multiplier 408 to an output from the detector 123a. Therefore, an image signal expressed by the following equation is generated.

$$L_4 = \alpha(L-R) + L \qquad \text{Equation 13}$$

An example in FIG. 4B will be described below. The first adder 401 adds the output from the detector 123a through the coefficient multiplier 405 to the output from the detector 123b to output R-L. The second adder 402 adds the output from the first adder 401 through the coefficient multiplier 406 to an output from the detector 122 through a coefficient multiplier 409. Therefore, an image signal expressed by the following equation:

$$R_5 = (1-\alpha)S + \alpha(R-L) \qquad \text{Equation 14}$$

The third adder 403 adds the output from the detector 123b through the coefficient multiplier 407 to the output from the detector 123a to output L-R. The fourth adder 404 adds the output from the third adder 403 through the coefficient multiplier 408 to an output from the scattered electron detector 122 through a coefficient multiplier 410. Therefore, an image signal expressed by the following equation is generated:

$$L_5 = (1-\alpha)S + \alpha(L-R) \qquad \text{Equation 15}$$

In this manner, in the example, adjustment values $L_{s1}$, $L_{s2}$, $L_4$, and $L_5$ of the luminance signal L and adjustment values $R_{s1}$, $R_{s2}$, $R_4$, an $R_5$ of the luminance signal R are expressed by the primary homogeneous expressions of the luminance signals S, L, and R.

Figure 5:
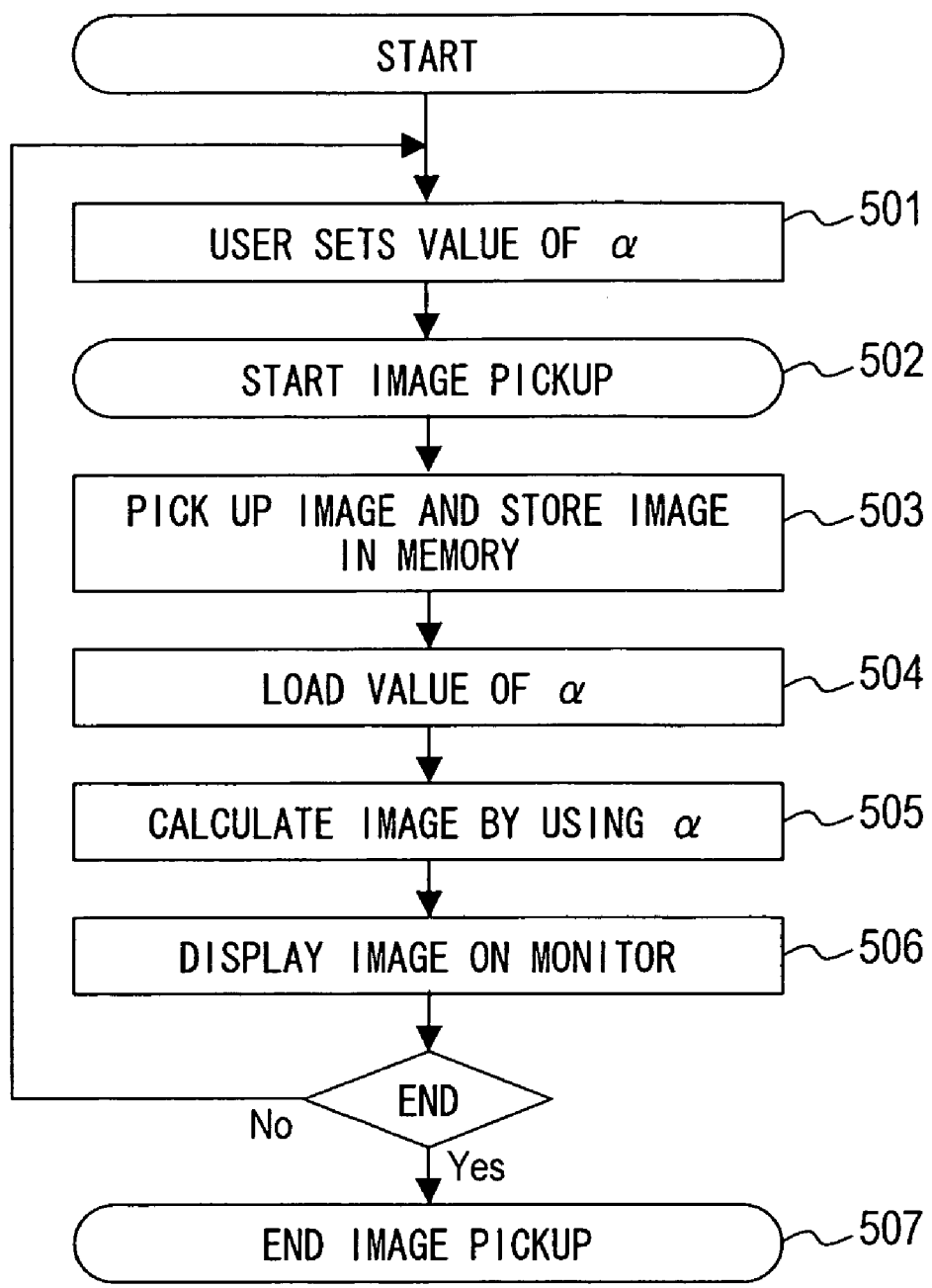
FIG. 5 is an explanatory diagram for explaining a procedure of a method of synthesizing image data according to the present invention.

An image processing method according to the present invention will be described below with reference to FIG. 5. In step S501, a user sets a value of the coefficient $\alpha$ representing a mixture ratio of the L image, the R image, and the S image. In step S502, image pickup is started. In step S503, image signals from the backscattered electron detectors 123a and 123b are acquired and stored in the image memory 115. An image of an electron microscope generally has a poor S/N ratio and integrates a plurality of images to display the integrated images as one image. At this time, in this stage, an image obtained by integrating a plurality of images about the L image, the R image, and the S image is stored in a memory. However, the integration may be performed after calculation in the next step S505. In step S504, the value of the coefficient $\alpha$ is loaded. In step S505, image data is calculated by using the coefficient $\alpha$. More specifically, the image processing unit 119 calculates any one of Equations 5 to 15 and stores a calculation result in the image memory 115. In step S506, the image is read from the image memory 115 and output to the display 117. When image display is kept on, the control returns to step S501 to continue the process. However, the display can be interrupted by the intention of the user or as a setting of the apparatus. In this case, the control proceeds to step S507 to stop outputting of the image.

Figure 6:
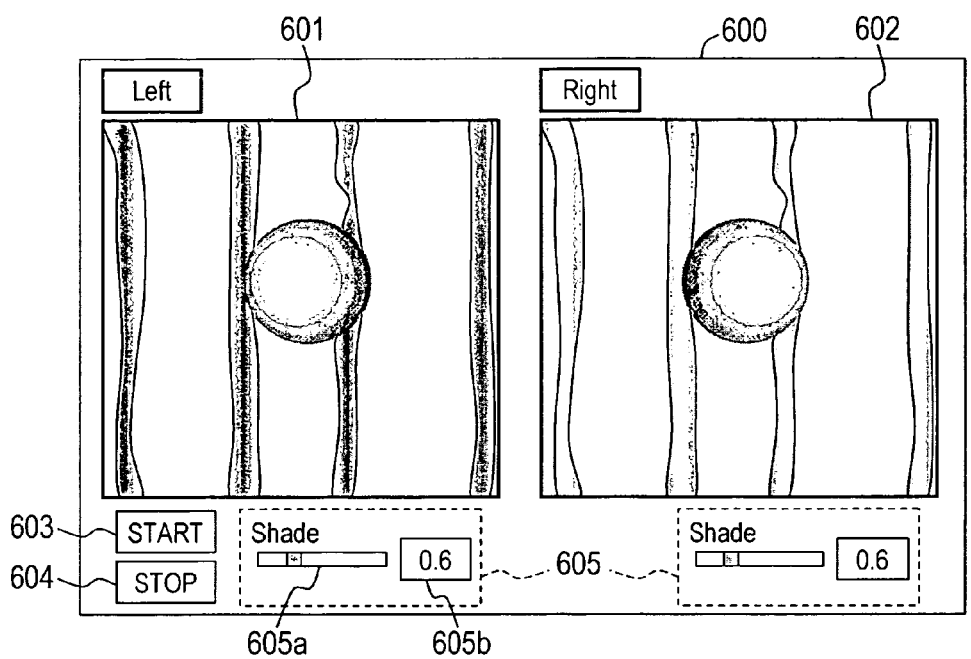
FIGS. 6A to 6D are diagrams showing an example of a display screen of a display of a scanning electron microscope according to the present invention.
Figure 6:
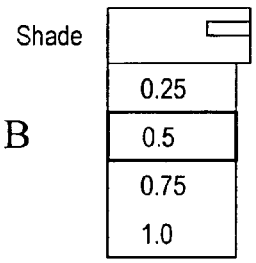
Figure 6:
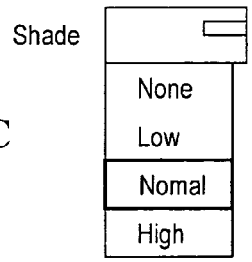
Figure 6:
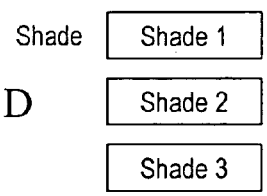

Examples of screens displayed on the display 117 will be described below with reference to FIG. 6. A screen 600 displays an L image 601 and an R image 602 at once. The screen 600 includes a start button 603, a stop button 604, and an $\alpha$ setting section 605. When the start button 603 is clicked, image pickup in step S502 is started. When the stop button 604 is clicked, outputting of an image in step S507 is stopped.

The $\alpha$ setting section 605 has a slide bar 605a and a numerical value column 605b. In order to set a value of $\alpha$, the slide bar 605a may be moved, and a number for the numerical value column 605b may be input or selected. The slide bar and the numerical value column are interlocked with each other.

When the slide bar 605a is moved, the number in the numerical value column 605b is automatically changed. When the number in the numerical value column is changed, the position of the slide bar automatically changes.

FIGS. 6B, 6C, and 6D show other examples of the α setting section 605. In the example shown in FIG. 6B, numbers 0.25, 0.5, 0.75, 1.0, and the like are given to the numerical value column. A user selects one of the numbers in the numerical value column. In the example shown in FIG. 6C, letters None, Low, Normal, High, and the like are given to the numerical value column in advance. The user selects one of the letters in the numerical value column. In the example shown in FIG. 6D, letters Shade 1, Shade 2, Shade 3, and the like are given to the numerical value column in advance. The user selects one of the letters in the numerical value column.

Figure 7:
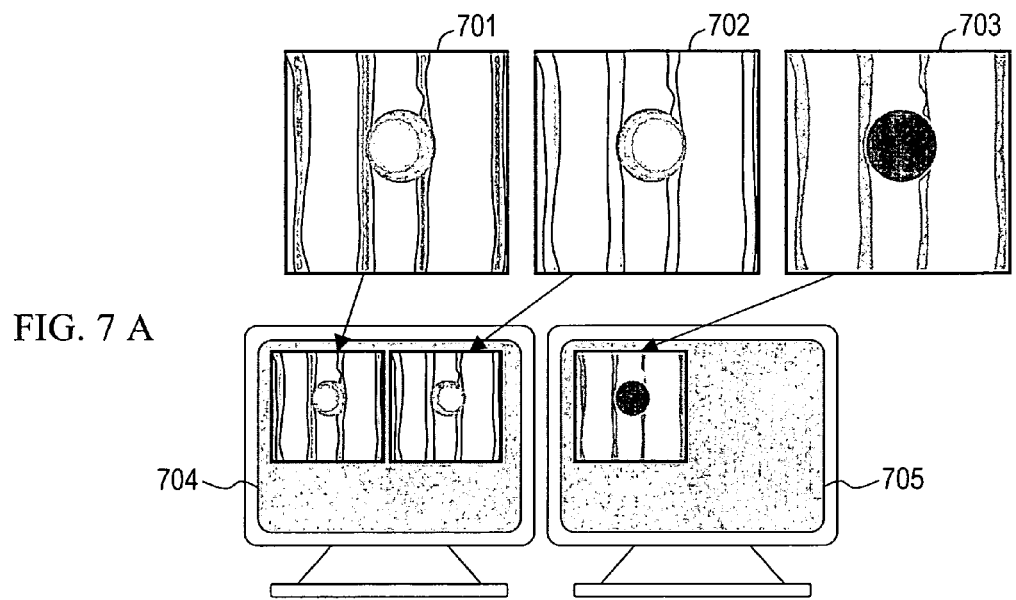
FIGS. 7A and 7B are diagrams showing examples of a display screen of a display of a scanning electron microscope according to the present invention.
Figure 7:
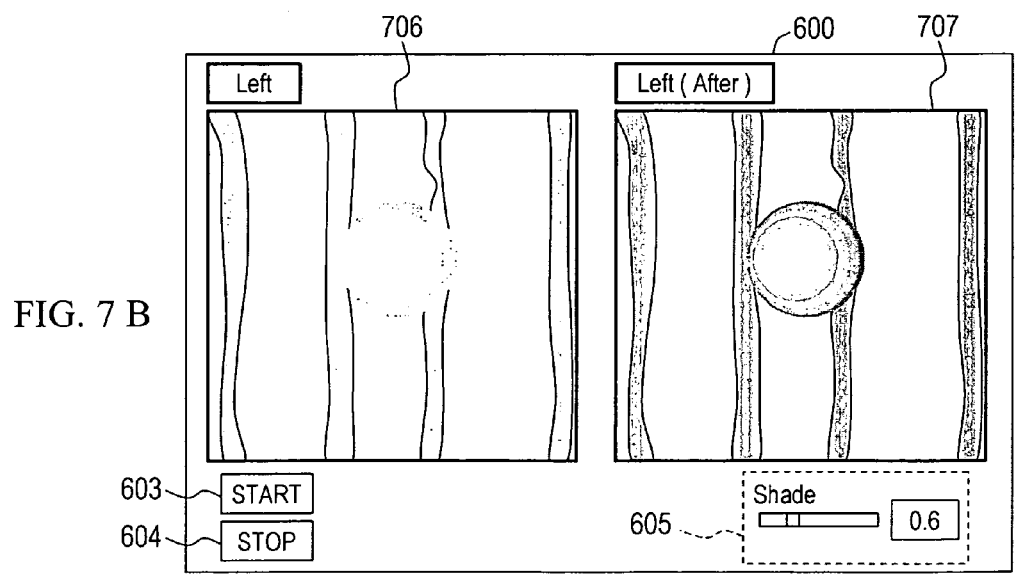

FIGS. 7A and 7B explains other examples of a screen displayed on the display 117. In the example in FIG. 7A, an L image 701 and an R image 702 are displayed on a screen 704, and an S image 703 is displayed on a screen 705. In the example in FIG. 7B, an L image 706 which is not adjusted and an L image 707 which is adjusted are displayed on the screen 600. The L image 707 is a result obtained by performing calculation by using an equation for calculating an adjustment value of the L image of the above equation along with the coefficient α provided in the α setting section.

Although a scanning electron microscope has been explained, the present invention can also be applied to a charged particle beam apparatus. A method of adjusting an image of a sample according to the present invention can also be applied to an optical microscope having one pair of oblique illuminations symmetrically arranged on both sides of the normal to the sample. When illumination light is irradiated from a direction oblique to the observing direction, an image corresponding to a backscattered electron image is obtained. When illumination light is irradiated from the same direction as an observation direction, an image corresponding to a scattered electron image is obtained. Therefore, when luminance signals of an optical image obtained by irradiating illumination light from a direction oblique to the observing direction are represented by $L_{OP}$ and $R_{OP}$, and when a luminance signal of an optical image obtained by irradiating illumination light from the same direction as that observing direction is represented by $S_{OP}$, the above equation can be directly used.

The examples of the present invention has been described. However, the present invention is not limited to the above example, and it will be apparent to persons skilled in the art that various changes can be effected without departing from the spirit and scope of the invention.

What is claimed is:

1. A scanning electron microscope having:
an electron beam irradiating system which irradiates an electron beam on a sample;
one pair of backscattered electron detectors which detects backscattered electrons from the sample; and
an image processing unit for calculating an adjustment value Lc for L and an adjustment value Rc for R by using first order homogeneous polynomial of luminance signals obtained by irradiating an electron beam, wherein said L corresponds to the luminance signal from one detector of said one pair of backscattered electron detectors and said R corresponds to the luminance signal from the other detector of said one pair of backscattered electron detectors, regarding the same region of the sample.

2. The scanning electron microscope according to claim 1, having
a scattered electron detector which detects scattered electrons from the sample, wherein
the image processing unit, when a luminance signal from the scattered electron detector is given by S, calculates an adjustment value Lc of L and an adjustment value Rc of R by using first order homogeneous polynomial of L, R, and S.

3. The scanning electron microscope according to claim 2, wherein
the first order homogeneous polynomial of L and R are expressed by the following expressions:

$Lc=S+(L-R)$ $Rc=S+(R-L)$.

4. The scanning electron microscope according to claim 2, wherein
the first order homogeneous polynomial of L and R are expressed by the following expressions by using an arbitrary coefficient $\alpha(0\leq\alpha\leq1)$:

$Lc=\alpha \cdot S+(1-\alpha)\cdot(L-R)$ $Rc=\alpha \cdot S+(1-\alpha)\cdot(R-L)$.

5. The scanning electron microscope according to claim 1 or 2, having a display which receives the image data to display an electron microscope image, wherein
the display displays images generated by the adjustment value Lc of L and the adjustment value Rc of R on one screen at once.

6. The scanning electron microscope according to claim 5, wherein
the display displays a screen having a GUI to set a coefficient α of the first order homogeneous polynomial.

7. The scanning electron microscope according to claim 1, wherein
the first order homogeneous polynomial of L and R are expressed by the following equations:

$Lc=(L-R)$ $Rc=(R-L)$.

8. The scanning electron microscope according to claim 1, wherein
the first order homogeneous polynomial of L and R are expressed by the following equations:

$Lc=(L+R)/2+(L-R)$ $Rc=(L+R)/2+(R-L)$.

9. The scanning electron microscope according to claim 1, wherein
the first order homogeneous polynomial of L and R are expressed by the following expressions by using an arbitrary coefficient $\alpha(0\leq\alpha\leq1)$:

$Lc=(L+R)/2+\alpha \cdot(L-R)$ $Rc=(L+R)/2+\alpha \cdot(R-L)$.

10. The scanning electron microscope according to claim 1, wherein
the first order homogeneous polynomial of L and R are expressed by the following expressions by using an arbitrary coefficient $\alpha(0\leq\alpha\leq1)$:

$Rc=\alpha \cdot(R-L)+R$ $Lc=\alpha \cdot(L-R)+L$.

11. An image generating method using a scanning electron microscope comprising the steps of:
irradiating an electron beam on a sample;
detecting backscattered electrons from the sample by one pair of backscattered electron detector; and
calculating an adjustment value Lc for L and an adjustment value Rc for R by using a first order homogeneous polynomial of luminance signals, when luminance signals from the pair of backscattered electron detectors regarding the same region of the sample are given by L and R.

12. The image generating method using a scanning electron microscope according to claim 11, having:
the step of detecting scattered electrons from the sample by a scattered electron detector; the step of, when a luminance signal from the scattered electron detector is given by S, calculating an adjustment value Lc of L and an adjustment value Rc of R by using first order homogeneous polynomial of L, R, and S.

13. The image generating method using a scanning electron microscope according to claim 12, wherein
the first order homogeneous polynomial of L and R are expressed by the following expressions by using an arbitrary coefficient $\alpha(0 \leq \alpha \leq 1)$:

$Lc = \alpha \cdot S + (1-\alpha) \cdot (L-R)$ $Rc = \alpha \cdot S + (1-\alpha) \cdot (R-L)$.

14. The image generating method using a scanning electron microscope according to claim 11, wherein
the first order homogeneous polynomial of L and R are expressed by the following expressions by using an arbitrary coefficient $\alpha(0 \leq \alpha \leq 1)$:

$Lc = (L+R)/2 + \alpha \cdot (L-R)$ $Rc = (L+R)/2 + \alpha \cdot (R-L)$.

15. The image generating method using a scanning electron microscope according to claim 11 or 12, having
the step of displaying images generated by the adjustment value Lc of L and the adjustment value Rc of R on one screen at once.

16. The image generating method using a scanning electron microscope according to claim 11 or 12, having
the step of displaying a screen having a GUI to set a coefficient $\alpha$ of the primary homogeneous expressions.

17. A charged particle beam apparatus having:
a charged particle beam irradiating system which irradiates a charged particle beam on a sample;
one pair of detectors which detect an information signal from the sample; and
an image processing unit which processes L image data and R image data obtained from each of the pair of detectors, respectively, and
calculates an adjustment value Lc for the L image data and an adjustment value Rc for the R image data by using first order homogeneous polynomial of luminance signals regarding the same region of the sample.

* * * * *